(12) United States Patent
Nelson et al.

(10) Patent No.: US 9,996,501 B1
(45) Date of Patent: Jun. 12, 2018

(54) VALIDATING DOCUMENT CONTENT PRIOR TO FORMAT CONVERSION BASED ON A CALCULATED THRESHOLD AS A FUNCTION OF DOCUMENT SIZE

(75) Inventors: Laura Ann Nelson, Seattle, WA (US); Michael Patrick Bacus, Seattle, WA (US); Xuping Zhang, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 516 days.

(21) Appl. No.: 13/535,661

(22) Filed: Jun. 28, 2012

(51) Int. Cl.
| | | |
|---|---|---|
| *H04N 21/482* | (2011.01) | |
| *H03H 17/00* | (2006.01) | |
| *H03M 7/30* | (2006.01) | |
| *G06F 17/00* | (2006.01) | |
| *G06F 17/24* | (2006.01) | |
| *G06F 17/30* | (2006.01) | |
| *G06N 5/00* | (2006.01) | |
| *G06F 17/21* | (2006.01) | |
| *G06N 3/08* | (2006.01) | |
| *G06N 5/04* | (2006.01) | |
| *G06N 5/02* | (2006.01) | |

(52) U.S. Cl.
CPC ............. *G06F 17/00* (2013.01); *G06F 17/24* (2013.01); *G06F 17/30017* (2013.01); *G06N 3/08* (2013.01); *G06N 5/00* (2013.01); *G06F 17/211* (2013.01); *G06N 3/082* (2013.01); *G06N 5/003* (2013.01); *G06N 5/02* (2013.01); *G06N 5/04* (2013.01)

(58) Field of Classification Search
CPC ... G06F 17/24; G06F 17/211; G06F 17/30017
USPC .......................................................... 715/201
See application file for complete search history.

(56) References Cited

U.S. PATENT DOCUMENTS

| | | | | |
|---|---|---|---|---|
| 5,041,917 A | * | 8/1991 | Koshiishi ................. | H04B 1/38 358/434 |
| 5,978,746 A | * | 11/1999 | Beneteau ................. | G01D 1/02 700/73 |
| 6,925,595 B1 | * | 8/2005 | Whitledge et al. .......... | 715/234 |
| 7,152,205 B2 | * | 12/2006 | Day ....................... | G06F 17/227 715/235 |
| 7,487,438 B1 | * | 2/2009 | Withers ............. | G06K 9/00449 382/151 |
| 7,653,840 B1 | * | 1/2010 | Taylor ................. | G06F 11/0727 714/47.2 |
| 2005/0182736 A1 | * | 8/2005 | Castellanos ..................... | 705/80 |
| 2009/0125413 A1 | * | 5/2009 | Le Chevalier et al. ........ | 705/26 |
| 2009/0150442 A1 | * | 6/2009 | Barnard et al. ............ | 707/104.1 |
| 2009/0300056 A1 | * | 12/2009 | Fu et al. ....................... | 707/102 |
| 2010/0122148 A1 | * | 5/2010 | Flynn .................... | G06F 11/108 714/773 |
| 2011/0066662 A1 | * | 3/2011 | Davis .......................... | 707/811 |

(Continued)

*Primary Examiner* — Cesar Paula
*Assistant Examiner* — Luu-Phuong Nguyen
(74) *Attorney, Agent, or Firm* — Lowenstein Sandler LLP (57) ABSTRACT

A content validation module receives an electronic media item in a first format. The content validation module may determine whether the electronic media item will contain errors when the electronic media item is converted to a second format. The content validation module may also obtain an error metric for the electronic media item and may refrain from converting the electronic media item to the second format if the error metric exceeds an error threshold.

21 Claims, 6 Drawing Sheets

(56) References Cited

U.S. PATENT DOCUMENTS

| | | | |
|---|---|---|---|
| 2011/0199535 A1* | 8/2011 | Isu | H04N 19/895 348/425.2 |
| 2012/0054605 A1* | 3/2012 | Kestell | 715/256 |
| 2012/0109634 A1* | 5/2012 | Lanin | G06F 17/2223 704/8 |
| 2012/0131427 A1* | 5/2012 | Artin | 715/201 |
| 2012/0240224 A1* | 9/2012 | Payne | H04L 63/1416 726/21 |
| 2012/0311426 A1* | 12/2012 | Desai et al. | 715/227 |

* cited by examiner

FIG. 1

```
<html>
  <head>
    <title style="font-size: 24pt; color: green">A Cool Book</title>
  </head>
  <audio>
    <source src="song.mp3" type="audio/mp3" />
  </audio>
  <body>
    <h1 style="font-size: 18pt; color: blue; background-color:blue">Chapter 1</h1>
    <p style="font-size: 30pt; color: black">This is the first chapter</p>
  </body>
</html>
```

VALIDATING DOCUMENT CONTENT PRIOR TO FORMAT CONVERSION BASED ON A CALCULATED THRESHOLD AS A FUNCTION OF DOCUMENT SIZE

BACKGROUND

A large and growing population of users enjoys entertainment through the consumption of media items, including electronic media, such as electronic books (also referred to herein as ebooks), electronic newspapers, electronic magazines, and other electronic reading material. Users employ various electronic devices to consume such publications. Among these electronic devices are electronic book readers, cellular telephones, smart phones, personal digital assistants (PDAs), portable media players, tablet computers, electronic pads, netbooks, desktop computers, notebook computers, and the like.

Many electronic media items (e.g., publications) are received or obtained from a content provider in the HyperText Markup Language (HTML) format. The electronic media items which are in the HTML format may also use stylesheets to define the presentation (e.g., the look, the formatting, colors, backgrounds, etc.) of the electronic media item. For example, the electronic media item may use cascading stylesheets (CSS) to define the presentation of the electronic media item. Stylesheets may be embedded within the content the electronic media item (e.g., embedded as an attribute within the HTML tags of the electronic media item), may be included inline (e.g., the stylesheet may be inserted as its own tag using a CSS "style" property which is included as part of an HTML tag), or may be included as a separate file. Other electronic media items may be provided or may be obtained from the content provider in different formats such as the Microsoft Word® format or the Portable Document Format (PDF), etc.

User devices (such as electronic book readers, cellular phones, smart phones, tablet computers, etc.) may not support the format used by the electronic media item or may use a different format for presenting electronic media items to a user. For example, an electronic reader may support an electronic publication (EPUB) format or a Mobipocket (MOBI) format. The electronic media item may be converted to the format which is used or supported by the user device.

BRIEF DESCRIPTION OF THE DRAWINGS

The present invention will be understood more fully from the detailed description given below and from the accompanying drawings of various embodiments of the present invention, which, however, should not be taken to limit the present invention to the specific embodiments, but are for explanation and understanding only.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of a method and apparatus are described for a content validation module that can validate content for an electronic media item. In one embodiment, the content validation module may analyze an electronic media item (e.g., an electronic publication) in a first format (e.g., Microsoft Word® format, Portable Document Format (PDF), hypertext markup language (HTML) format (with without stylesheets), extensible markup language (XML) format (with or without stylesheets), etc.). The content validation module may determine whether the electronic media item (e.g., the content of the electronic media item, including but not limited to the words, sentences, paragraphs, characters, tablets, lists, head notes, footnotes, images, titles, headings, indices, of the electronic media item etc.) will contain errors (e.g., display errors which may cause the electronic media item to display incorrectly, formatting errors which may cause the formatting of the content electronic media item to be presented incorrectly, incompatibilities, etc.) when the electronic media item is converted to a second format (e.g., an electronic publication (EPUB) format or a Mobipocket (MOBI) format). In one embodiment, the second format may be more secure (e.g., the second format may support security features such as encryption or password protection, or may support digital rights management (DRM) features).

In one embodiment, the content validation module may generate or obtain a document object model (DOM) tree for the electronic media item (e.g., for the electronic publication). The content validation module may evaluate one or more rules based on or using the DOM tree for the electronic media item to determine whether the electronic media item will contain errors when the electronic media item is converted from the first format to the second format.

In one embodiment, the content validation module may calculate or obtain an error metric for the electronic media item. The error metric may be indicative of one or more of the number of errors, the severity of the errors, and the type or level of the errors. The content validation module may determine whether the error metric exceeds an error threshold (e.g., a number or other value) and may provide an error notification (e.g., send a message to a server or provide an indication to a user) if the error metric exceeds an error threshold (e.g., the content validation module may not convert the electronic media item to the second format if the error metric exceeds the error threshold). A digital content providing system may receive hundreds, thousands, or tens of thousands of digital media items a day. The large volume of digital media items may make it difficult to have human users manually check each electronic media item to determine whether the electronic media item contains errors. In one embodiment, the content validation module may allow the digital content providing system to process the multitude of electronic media items which are received and to determine the quality (e.g., the number of errors and the severity of the errors) in the electronic media items, more efficiently and more quickly.

Figure 1:
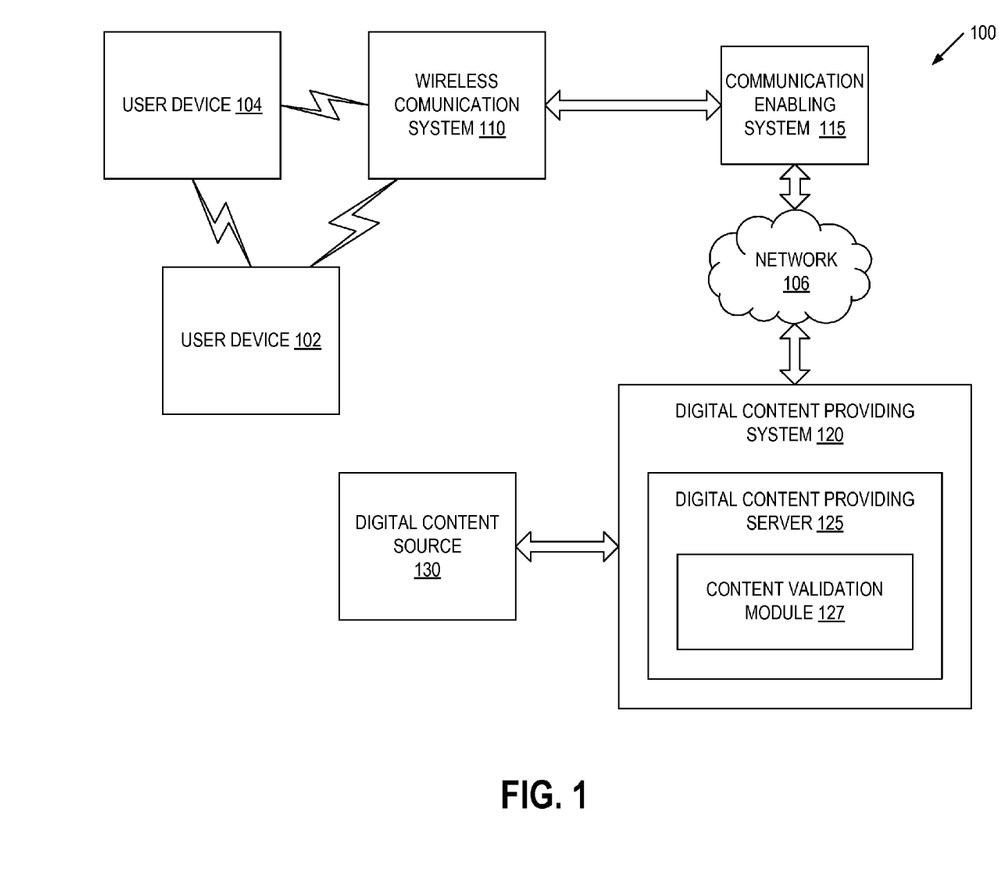
FIG. 1 is a block diagram of an exemplary network architecture, in which embodiments of the present invention may operate.

FIG. 1 is a block diagram of an exemplary network architecture 100, in which embodiments of the present invention described herein may operate. The network architecture 100 may include a digital content providing system 120 and one or more user devices 102, 104 capable of communicating with the digital content providing system 120 via a network 106. Network 106 may include, for example, a public network such as the Internet or a private network such as a local area network (LAN).

The user devices 102, 104 may be portable computing devices such as electronic book readers or tablet computers (e.g., that include a book reader application). Other examples of portable computing devices include smart phones, cellular telephones, personal digital assistants (PDAs), portable media players, netbooks, and the like. The user devices 102, 104 may also be non-portable computing devices such as a desktop computer, a set-top box associated with a television, a gaming console, and so on. The user devices 102, 104 are variously configured with different features to enable consumption of one or more types of digital content and electronic media items. The digital content and electronic media items may include electronic books (ebooks) such as electronic textbooks and/or other electronic publications (electronic versions of publications) such as electronic magazines, digital newspapers, digital audio books, electronic journals, real simple syndication (RSS) feeds, etc. The media items may also include digital video (e.g., movies, television, short clips, etc.), images (e.g., art, photographs, etc.), audio files, and multi-media content.

The digital content providing system 120 may correspond to any feature or combination of features for providing electronic media items or other digital content to the user devices 102, 104. The digital content providing system 120 may include a network-accessible server-based functionality (digital content providing server 125), various data stores (not shown), and/or other data processing equipment. The digital content providing system 120 may be implemented by a single machine or a cluster of machines. The digital content providing system 120 may include one or more machines (e.g., one or more server computer systems, routers, gateways, etc.) that have processing and storage capabilities to provide the server-based functionality.

In one embodiment, the digital content providing server 125 corresponds to an entity which provides electronic media items (e.g., electronic books) to users upon the users' purchase of the items. In this role, the digital content providing server 125 may essentially act as a bookseller or the like. In other cases, the digital content providing server 125 corresponds to an entity which provides electronic media items to users on a non-fee basis or on the basis of some other type of alternative compensation arrangement. Thus, the term a "provider" of items should be construed broadly to encompass educational institutions, governmental organizations, libraries, non-profit organizations, retailers, auction services, and so on, or some cooperative combination of any two or more entities.

The digital content providing server 125 may deliver, and the user devices 102, 104 receive, electronic media items (or other media items), search results, upgrades, and/or other information via the network 106. For example, the user devices 102, 104 may download or receive ebooks from the digital content providing server 125. The digital content providing server 125 may also receive various requests (e.g., search queries), instructions and other data from the user devices 102, 104 via the network 106.

Communication between the user devices 102, 104 and the item providing system 120 may be enabled via any communication infrastructure. One example of such an infrastructure includes a combination of a wide area network (WAN) and wireless infrastructure, which allows a user to use the user devices 102, 104 to purchase digital content (e.g., electronic media items) and consume the digital content without being tethered to the digital content providing system 120 via hardwired links. The wireless infrastructure may be provided by one or multiple wireless communications systems, such as wireless communication system 110. In one embodiment, wireless communication system 110 may be a wireless fidelity (WiFi) hotspot connected with the network 106. Wireless communication system 110 may also be a wireless carrier system that can be implemented using various data processing equipment, communication towers, etc. Alternatively, or in addition, the wireless carrier system may rely on satellite technology to exchange information with the user devices 102, 104.

The communication infrastructure may also include a communication-enabling system 115 that serves as an intermediary in passing information between the digital content providing system 120 and the wireless communication system 110. The communication-enabling system 115 may communicate with the wireless communication system 110 (e.g., a wireless carrier) via a dedicated channel, and may communicate with the digital content providing system 120 via a non-dedicated communication mechanism, (e.g., a public Wide Area Network (WAN) such as the Internet).

In addition to wirelessly connecting to wireless communication system 110, user devices 102, 104 may also wirelessly connect to other user devices 102, 104. For example, user device 102 may form a wireless ad hoc (peer-to-peer) network with user device 104 using WiFi, Bluetooth, or other wireless communication protocols.

In one embodiment, digital content providing server 125 may include content validation module 127. The content validation module 127 may process or analyze an electronic media item (e.g., an electronic publication) in a first format (e.g., Microsoft Word® format, PDF format, HTML format (with or without stylesheets), XML format (with or without stylesheets), etc.) prior to providing the electronic media item to user or user devices. The content validation module 127 may determine whether the electronic media item (e.g., the content, such as the text, tables, lists, indices, etc., of the electronic media item) will contain errors (e.g., display errors which may cause the electronic media item to display incorrectly, formatting errors, incompatibilities, etc.) when the electronic media item is converted to a second format (e.g., an electronic publication (EPUB) format or a Mobipocket (MOBI) format). For example, the second format may not support (e.g., may not have) certain features which are supported in the first format (e.g., the MOBI format may not support the use of certain HTML tags in an electronic media item). This may cause the electronic media item to display improperly or to have formatting issues, when the electronic media item is converted to the second format. In another example, the electronic media item may have one or more errors (e.g., a display or formatting error) when the electronic media item is in the first format (e.g., may contain errors in its original format prior to being converted to the second format). The second format may be more secure than the first format. For example, the second format may support security features by allowing a user to encrypt the electronic media item or by allowing a user to password protect the electronic media item. In another example, the second format may support digital rights management (DRM) features (e.g., may allow the electronic media item to be viewed a certain number of times, viewed for a certain period of time, viewed by certain users, viewed using certain user devices, etc.).

In one embodiment, the content validation module 127 may calculate or obtain an error metric (e.g., a number or some other value) for the electronic media item. The error metric may be indicative of one or more of the number of errors, the severity of the errors, and the type of the errors. In one embodiment, the error metric may be obtained or calculated by determining a type or level for each of the errors, assigning a different weight to each type of error, determining the number of each type or level of error, multiplying the weight of each type or level of error with the number of errors in each type or level of error, and adding all of the weighted numbers. For example, if there are four different types or levels of errors (Level 1, Level 2, Level 3, and Level 4) and each of the errors have a corresponding weight (Weight 1=0.005, Weight 2=3.0, Weight 3=50.0, and Weight 4=1000), the error metric may be computed as follows: Error Metric=(number of Level 1 errors*Weight 1)+(number of Level 2 errors*Weight 2)+(number of Level 3 errors*Weight 3)+(number of Level 4 errors*Weight 4). In other embodiments, the error metric may be calculated using different types of methods, formulas or equations. For example, a polynomial or exponential formula using one or more of the number of errors, the number of each type of error, and the weights associated with each type of error, may be used to calculate the error metric. In another example, a neural network may be used to calculate an error metric using one or more of the number of errors, the number of each type of error, and the weights associated with each type of error.

In one embodiment, multiple occurrences of the same error (e.g., multiple occurrences of a particular HTML tag with a particular attribute and value) may be counted as single error, rather than counting each occurrence as an error. For example, if a supported CSS property appears fifteen times in an electronic document, this may count as one single error, rather than fifteen different errors, when computing the error metric.

In one embodiment, the type (e.g., the level) of the error may be based on the effect an error may have on a user's experience when viewing the electronic media item. For example, referring to the above example, a Level 1 error may be a minor error which is may be barely noticeable by the user, a Level 2 error may be an error which is noticeable but does not disrupt the user's viewing experience, a Level 3 error may be an error which is very noticeable and may result in the user having difficulty or being unable to view an electronic media item, and Level 4 error may be a severe error which may cause serious issues when the user attempts to view the electronic media item (e.g., may cause a user device to crash, or a media viewing program to crash).

In one embodiment, the error types may include an informational error type (e.g., a Level 0) error. An informational error may not be an actual error, but rather, may be used to track or identify how many times a particular feature (e.g., a particular HTML tag or a particular CSS property) appears in an electronic media item. In one embodiment, an informational error type may be associated with a weight of 0, because the information error type may not indicate actual errors in the electronic media item. This may allow the content validation module 127 to track features (e.g., an HTML tag) without affecting the calculation of the error metric. Informational errors are discussed further below in conjunction with FIG. 4 and Table 1.

The content validation module 127 may determine whether the error metric exceeds an error threshold (e.g., a number or other value) and may provide an error notification (e.g., send a message to a server or provide an indication to a user) if the error metric exceeds an error threshold. In one embodiment, the error threshold may be based on the size or length of the electronic media item. For example, if the electronic media item is larger (e.g., it has more content or has more words or characters), the error threshold may be higher than if the electronic media item is smaller (e.g., it has less content or has fewer words or characters). In other embodiments, any number of different types of errors may be used (e.g., there may be ten types of errors or twenty types of errors) and a variety of values may be used for the different weights (e.g., any number, decimal, fraction, or value may be used).

In one embodiment, the content validation module 127 may generate or obtain a document object model (DOM) tree for the electronic media item (e.g., for the electronic publication). The content validation module 127 may evaluate one or more rules based on or using the DOM tree for the electronic media item to determine whether the electronic media item will contain errors when the electronic media item is converted from the first format to the second format. For example, the content validation module 127 may traverse the DOM tree to find certain types of nodes or certain sequences of nodes in the DOM tree. In one embodiment, the content validation module 127 may convert the electronic media item to an intermediate format, in order to generate a DOM tree of the electronic media item. For example, the electronic media item may be in Microsoft Word® format or PDF format. The content validation module 127 may process the electronic media item, and convert it into an intermediate format. In one embodiment the intermediate format may be a markup language format such as HTML or XML, and the intermediate format may also support the use of stylesheets such as CSS or XSL. In another embodiment, the intermediate format may be any format from which a DOM tree may be generated. The content validation module 127 may obtain or generate a DOM tree from the intermediate format and may evaluate one or rules based on the DOM tree obtained or generated from the intermediate format.

In one embodiment, the content validation module 127 may also track the number of times a feature in the format of an electronic media item is used. For example, if the electronic media item is in an HTML format and uses CSS, the content validation module 127 may track the number of times a particular HTML tag or a particular CSS feature is used. The content validation module 127 may count the number of times a particular type of node appears in the DOM tree to track a feature. This may allow a user to track whether a new feature (e.g., a new tag) added into the HTML format becoming popular or being used more frequently. In one embodiment, the content validation module 127 may track these features across multiple electronic media items.

Content validation module 127 may analyze electronic media items and may obtain error metrics for the electronic media items before converting the electronic media items to a format used by user devices. The electronic media items may be electronic media items which are currently offered to users by digital content providing server 125 or may be newly received electronic media items from digital content source 130. Digital content source 130 may be, for example, a publisher, author, creator, etc. of electronic media items or other digital content that provides the digital content to be distributed by digital content providing system 120. Content validation module 127 is described in greater detail below with reference to FIGS. 4-6.

Although some embodiments of the present disclosure are described with reference to the HTML format and CSS stylesheets, it should be understood that these are merely examples. Other embodiments of the present disclosure may use other types of formats or markup languages (e.g., XML or any other format which allows the generation of a DOM tree), other types of stylesheets (e.g., extensible stylesheet language (XSL) stylesheets).

Figure 2:
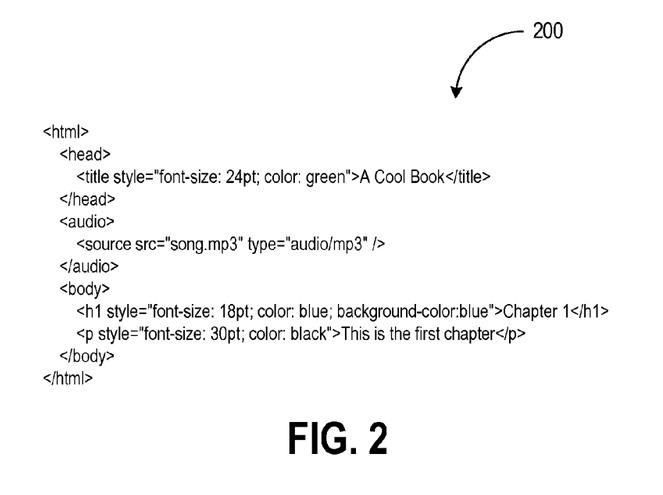
FIG. 2 is an exemplary electronic media item.

FIG. 2 is an exemplary electronic media item 200. As shown in FIG. 2, the electronic media item 200 is in HTML format (e.g., the electronic media item is an HTML file). The electronic media item 200 includes inline CSS (e.g., inline stylesheets which are included as attributes and values within a tag) as shown in the "title" tag, the "h1" (heading) tag, and the "p" (paragraph) tag. The electronic media item 200 includes a head section, (e.g., the "head" tag), an audio object (e.g., the "audio" tag which references "song.mp3"), and a body section (e.g., the "body" tag) which includes a heading (e.g., the "h1" tag) and a paragraph (e.g., the "p" tag). As discussed above, CSS (e.g., CSS information or format/style information) may be included in the electronic media item 200 using a variety of methods. In other embodiments, the electronic media item 200 may use a separate CSS file rather than embedding the CSS information or including the CSS information inline (as shown in FIG. 2).

Figure 3:
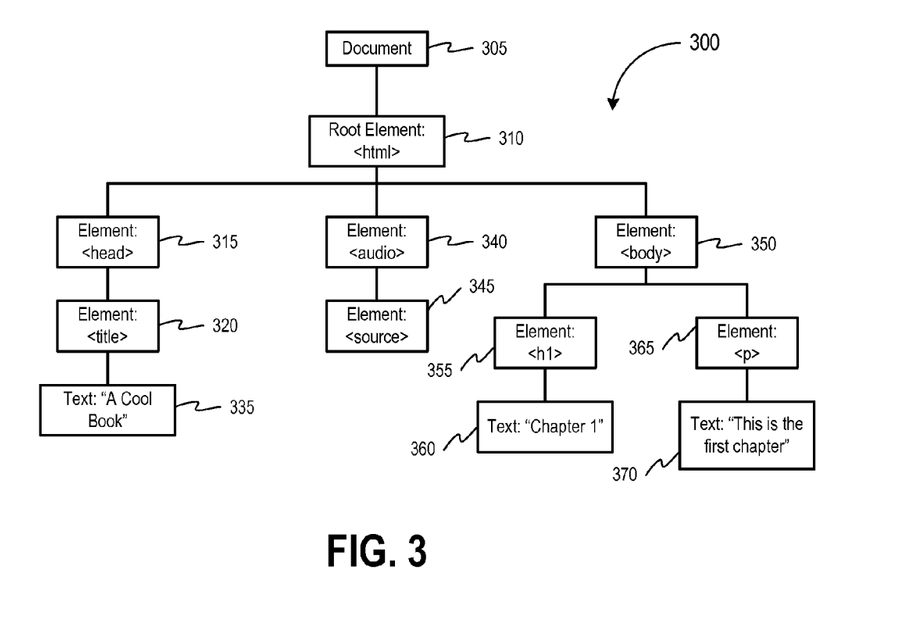
FIG. 3 is an exemplary document object model (DOM) tree for the electronic media item illustrated in FIG. 2.

FIG. 3 is an exemplary document object model (DOM) tree 300 for the electronic media item 200 illustrated in FIG. 2. The DOM tree 300 may be generated based on the electronic media item 200 (e.g., based on the HTML file). The DOM tree 300 is a simplified DOM tree of the electronic media item 200 (e.g., the DOM tree 300 does not contain all of the nodes for the electronic media item 200). For example, the DOM tree 300 does not show the node which represents the "src" attribute of the "source" tag shown in FIG. 2 and does not show the node which represents the "font-size" attributes for the "h1" and "p" tags. These additional nodes have been omitted for ease of illustration in the present disclosure. Some embodiments of the present disclosure may generate a complete DOM tree for electronic media items (e.g., may not omit any nodes in the DOM tree.

Referring back to FIG. 3, the DOM tree 300 includes a document node 305. The document node 305 may correspond to the electronic media item 200 shown in FIG. 2. The document node 305 has a single child node, the "html" node 310, which is the root of the DOM tree 300. The "html" node 310 may correspond to the "html" tag shown in FIG. 2. The "html" node 310 has three child nodes, the "head" node 315, the "audio" node 340, and the "body" node 350. The "head" node 315 may correspond to the "head" tag in FIG. 2, the "audio" node 340 may correspond to the "audio" tag in FIG. 2, and the "body" node 350 may correspond to the "body" tag in FIG. 2. The "head" node has a single child node, the "title" node 320, which may correspond to the "title" tag shown in FIG. 2. The "title" node 320 has a single child node, the text node 335, which may correspond to the text "A Cool Book," shown in FIG. 2. The "audio" node 340 has a single child, the "source" node 345, which may correspond to the "source" tag shown in FIG. 2.

The "body" node 350 has two child nodes, the "h1" node 355 which may correspond to the "h1" tag shown in FIG. 2, and the "p" node 365 which may correspond to the "p" tag shown in FIG. 2. The "h1" node 355 has a single child node, the text node 360, which may correspond to the text "Chapter 1" shown in FIG. 2. The "p" node 365 also has a single child node, the text node 370, which may correspond to the test "This is the first chapter" shown in FIG. 2.

Figure 4:
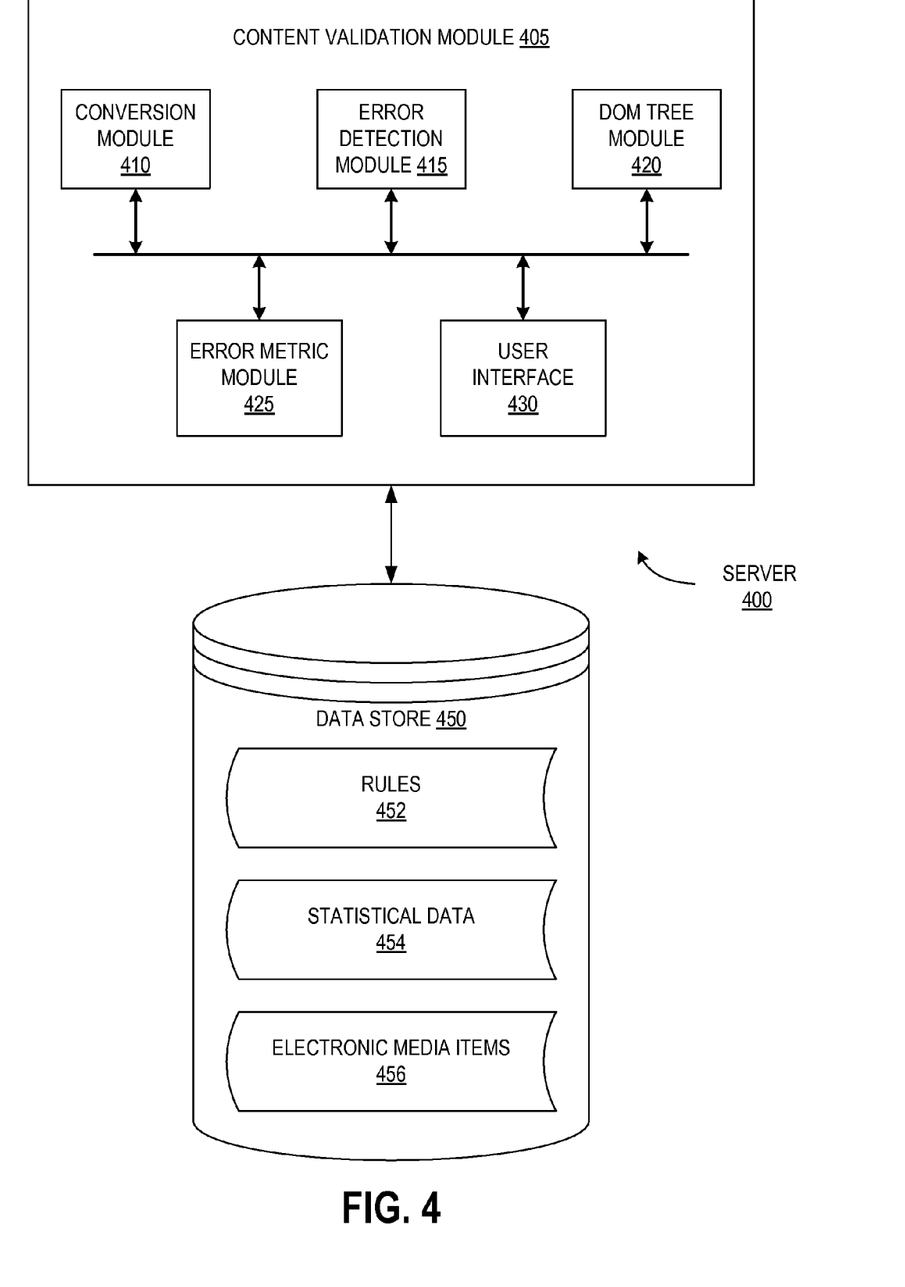
FIG. 4 is a block diagram illustrating a content validation module, according to an embodiment.

FIG. 4 is a block diagram of one embodiment of a content validation module 405 that may be included in a server 400 (e.g., digital content providing server 125 of FIG. 1). In one embodiment, server 400 includes content validation module 405, which may include a conversion module 410, an error detection module 415, a DOM tree module 420, an error metric module 425, and a user interface 430. In one embodiment, content validation module 405 is connected to a data store 450, which may be a file system, database or other data management layer resident on a data storage device such as a disk drive, RAM, ROM, database, etc. Data store 450 may include one or more rules 452, statistical data 454, and one or more electronic media items 456. The electronic media items 456 may include both electronic media items which have not been analyzed or processed by the content validation module 405, and electronic media items which have been processed or analyzed by the content validation module 405. The electronic media items 456 may also include converted electronic media items (e.g., electronic media items which have been converted to a second format). In one embodiment, the original electronic media items (e.g., electronic media items in the first format) may be stored in a different data store than the converted electronic media items (e.g., electronic media items that have been converted to the second format). In another embodiment, the content validation module 405 may analyze electronic media items 456 and determine whether the electronic media items 456 will contain errors when the electronic media items are converted to a second format. The content validation module 405 may calculate or obtain an error metric and may determine whether the error metric for an electronic media item exceeds an error threshold. If the error metric exceeds the error threshold, the content validation module may provide an error notification (e.g., send a message to a server or provide an indication to a user). In another embodiment, the convent validation module 405 may also determine the frequency of occurrence of certain features in electronic media items 456 (e.g., the number of times particular HTML or CSS elements or tags appear in electronic media items).

In one embodiment, the rules 452 may include one or more rules that may be evaluated using a DOM tree. As discussed further below in conjunction with FIGS. 4-6, the content validation module 405 may generate a DOM tree for an electronic media item or may convert the electronic media item into an intermediate format (e.g., HTML with CSS, XML with XSL, etc.) and may generate a DOM tree based on the intermediate format. A DOM tree may be used to represent one or more of the content, structure, layout or formatting for an electronic media item (as discussed above in conjunction with FIGS. 2-3). The rules 452 may be more simple rules that indicate whether certain types of nodes in the trees are allowed (e.g., may indicate that the HTML "audio" tag is an error if it is in the DOM tree), whether certain attributes of nodes in the tree are allowed (e.g., may indicate that the "max-width" attribute for a stylesheet, such as CSS, is an error), or whether certain values for attributes of nodes in the tree are allowed (e.g., may indicate that a "background-color" attribute for a "paragraph" tag having the value "black" is an error). The rules may also indicate whether certain nodes are allowed to have certain attributes or certain values for an attribute.

The following table, Table 1, includes examples of simple rules (may be included in the rules 452) for an electronic media item which may be in HTML format. Each row (except for the first row) represents a single rule. Each rule includes a "Tag" which may indicate what tag applies to the rule, an "Attribute" which may indicate what attribute applies to the rule, a "Value" which may indicate what value for an attribute applies to the rule, and an error level (e.g., the type or level of the error). A "*" symbol in the attribute column may indicate that any attribute may satisfy a rule and a "*" symbol in the value column may indicate that any value for the attribute may satisfy a rule. For example, as shown in Table 1, an "audio" tag may be a severe error (e.g., a level 4 or type 4 error) regardless of the attribute or value of the attribute for the "audio" tag. In another example, as shown in Table 1, a "p" tag is a level 2 error if the "p" tag has a CSS property "max-height" with any value. In a further example, a "p" tag is a level 1 if it has a CSS property "background-color" with a value of "black."

Table 1 also illustrates an informational error (e.g., a level 0 or type 0 error). As indicated above, a rule may be used to track the number of times a particular feature (e.g., a particular HTML tag or CSS property) is present within an electronic media item. The informational error may be used to track the number of times the particular feature is within an electronic media item. In one embodiment, a rule may be defined for an informational error. The rule may indicate that a particular tag, with a particular attribute and value should be classified as an informational error (e.g., a level 0 error). For example, the "hr.c" tag with the CSS property "background-color" and a value of "black" is identified as a level 0 error (e.g., an informational error). The rule for the "hr.c" tag may allow the content validation module 405 to track the number of times the hr.c" tag occurs in an electronic media item.

TABLE 1

| TAG | ATTRIBUTE | VALUE | ERROR LEVEL |
| --- | --- | --- | --- |
| hr.c | background-color | black | 0 |
| base | * | * | 1 |
| list | * | * | 1 |
| svg | * | * | 1 |
| object | * | * | 3 |
| p.style | background-color | black | 2 |
| p.style | max-height | * | 1 |
| audio | * | * | 4 |
| xml-stylesheet | * | * | 1 |
| style | max-width | * | 1 |

The rules 452 may also include more complex rules which may indicate whether a certain order or combination of one or more of nodes, attributes, and values are allowed (e.g., whether one type of node may be a child another type of node, or whether one type of node may have a certain attribute if it is a child of another type of node, etc.). In one embodiment, the rules 452 may be applied across different levels or the same level of a DOM tree. For example, a rule may indicate that there is an error if a first type of node has a grand-child node of a second type. In another example, a rule may indicate that there is an error if a first type of node has a sibling node of a second type. In one embodiment, the rules may be applied across multiple DOM trees. For example, an electronic media item may include multiple HTML files. A DOM tree may be created for each of the multiple HTML files. A rule may indicate that there is an error if a first type of node appears in a first DOM tree and a second type of node appears in a second DOM tree.

In one embodiment, the statistical data 454 may include data such as the number of errors found in an electronic media item, the type of the errors found in the electronic media item, and the location of the errors in the electronic media item. The statistical data 454 may also include data (e.g., number, type, and location of errors) for multiple media items which have been processed or analyzed by the content validation module 405. This may allow users to track or report the number of errors and type of errors which may be found in electronic media items. In another embodiment, the statistical data 454 may include data indicating the number of times a particular feature or aspect of an electronic media item (e.g., a particular HTML tag or a particular CSS property or element) appears (e.g., level 0 or type 0 errors). This may allow users to track the frequency or use of certain features of electronic media items (e.g., certain tags such as the "audio" or "video" tags).

In one embodiment, the DOM tree module 420 may generate a DOM tree (such as the DOM tree 300 shown in FIG. 3) for an electronic media item. For example, if an electronic media item is in HTML format (with or without CSS) or in XML format (with or without XSL), the DOM tree module 420 may generate a DOM tree which may represent one or more of the content, structure, layout or formatting for an electronic media item. The DOM tree module 420 may also use the conversion module 410 to convert an electronic media item into an intermediate format and may generate a DOM tree based on the intermediate format. For example, the DOM tree module 420 may use the conversion module 410 to convert an electronic media item in PDF format to an HTML or XML format which uses CSS or XSL, and may generate a DOM tree using the HTML format.

In one embodiment, the error detection module 415 may determine whether an electronic media item will contain one or more errors when the electronic media item is converted to a second format. The error detection module 415 may use the rules 452 (e.g., may evaluate or apply the rules 452) when determining whether an electronic media items will contain errors (e.g., when detecting or identifying errors in the electronic media item). For example, a rule may indicate that a particular feature of the first format (e.g., the HTML "audio" tag) is not supported by the second format (e.g., is not supported by the MOBI format). In another example, a rule may indicate that a particular feature of the electronic media item (e.g., a particular HTML tag with a specific attribute or attribute value) may not display properly when the electronic media item is converted to the second format and that the particular feature is an error.

In one embodiment, the error detection module 415 may use the DOM trees generated by the DOM tree module 420 when applying or evaluating the rules 452. For example, the error detection module 415 may traverse the nodes of a DOM tree or may traverse the nodes of multiple DOM trees in order to determine whether a combination of one or more of the nodes, attributes, or values in the DOM trees satisfy the rule. For example, if the error detection module 415 traverses a DOM tree and detects an "audio" node within the DOM tree, the error detection module 415 may determine that a rule is satisfied and that the "audio" node may be an error in the electronic media item (e.g., may identify the "audio" tag to be an error).

Referring back to FIG. 2, the error detection module 415 may determine that the "audio" tag is not supported by a particular format and that the electronic media item will contain errors if it is converted to the particular format (e.g., converted from an HTML format to a MOBI format), based one or more of the rules 425 and the DOM tree. The error detection module 415 may also determine that the background color and the text color of the "h1" tag (e.g., the heading "Chapter 1") are the same color and that the text of the "h1" tag (e.g., Chapter 1) may not be visible, based on one or more of the rules 452. The error detection module 415 may determine that this is also an error. The error detection module 415 may further determine that the font size of the text in "p" tag (e.g., the font size of text "This is the first chapter" in paragraph tag is 30) is larger than the font size of the previous "h1" tag (e.g., font size of the test in the heading tag is 18). The error detection module 415 may determine that this is an error based on one or more of the rules 452 because the body text of a page is generally smaller than the heading text in a page. It should be understood that a variety of display errors, formatting errors, content errors, etc., may be identified using the one or more rules 452. For example, error detection module may determine that text may be indented incorrectly when an electronic media item is converted to a second format. The rules 452 may indicate that the incorrect indentation is a minor error (e.g., a Level 1 error) if the text is in the main text of the electronic media item, but the incorrect indentation should be a more serious error (e.g., a Level 3 error) if the incorrect indentation is in the index or table of contents of the electronic media item.

In one embodiment, the error metric module 425 may calculate or obtain an error metric based on the errors detected by the error detection module 415. As discussed above, the convention validation module 405 may use any number of different levels or types of errors, and may use any value or number for the weights associated with the different levels or types of errors. In one embodiment there may be "N" different levels and "N" different weights associated with the levels and the error metric module 425 may obtain the error metric as follows: Error Metric= (number of Level 1 errors*Weight 1)+ . . . +(number of Level N errors*Weight N). In other embodiments, the number of levels or types of errors may be different from the number of weights. For example, there may be eight different level or types of errors and five different weights. Thus, two or more levels or types of errors may be associated with the same weight (e.g., may use the same weight)

In one embodiment, the error metric module 425 may determine the type or level of each error. For example, the error metric module 425 may access the rules 452 to determine the level of an error. In another embodiment, error metric module 425 may access the statistical data 454 to obtain data indicative of the errors in an electronic media item and the corresponding types or levels of the errors. For example, the error detection module 415 may record or store each error and the corresponding type or level of the error, in the statistical data store 454 and the error metric module 425 may access this information or data when determining or obtaining the error metric. In one embodiment, the weights for each type or level of error may also be stored in the data store 450 (e.g., as part of the rules 452).

In one embodiment, the error metric module 425 may determine an error threshold for an electronic media item based on a size or length. As discussed above, the error threshold hold may be based on the length or size of an electronic media item. For example, an electronic media item having a size of 150 kilobytes may have a lower error threshold (e.g., 500) than an electronic media having a size of 1000 kilobytes (which may have an error threshold of 4500). In another example, an electronic media item which has 100000 lines of text may have a higher error threshold than an electronic media item which has only 35000 lines of text. The error metric module 425 may analyze an electronic media item to determine the size or length of an electronic media item and may determine or obtain the error metric based on the size or length. In another embodiment, the error metric module 425 may obtain the error threshold from the data store 450 (e.g., the error threshold may be stored as part of the rules 452).

In one embodiment, the conversion module 410 may convert an electronic media item in a first format (e.g., HTML format with CSS) to a second format (e.g., EPUB format or MOBI format). The conversion module 410 may convert the electronic media item based on the error metric and error threshold obtained by the error metric module 425. For example, the error metric module 425 may determine that the error metric of an electronic publication is 556 and the error threshold is 525. The conversion module 410 may provide an error notification (e.g., send a message to a server or provide an indication to a user) because the error metric is higher than the error threshold. In another example, the error metric module 425 may determine that the error metric of an electronic publication is 217 and the error threshold is 300. The conversion module 410 may convert the electronic media item to the second format because the error metric is less than the error threshold. In another embodiment, the conversion module 410 may also convert an electronic media item in a first format into an intermediate format. For example, if an electronic media item is in Microsoft Word® format, the conversion module 410 may convert to the electronic media item in to an intermediate format (e.g., HTML with CSS, XML with XSL, etc.), where the intermediate format may allow a DOM tree to obtained or generated.

In one embodiment, the user interface 430 may provide or present an electronic media item to a user and may indicate which portions of the electronic media item contain errors detected by the error detection module 415. For example, the user interface 420 may display a page from an electronic media item and may highlight a certain paragraph or sentence within the page (e.g., highlight with a red color) which contains an error. In other embodiments, the user interface 430 may use other different methods of indicting errors in an electronic media item. For example, the user interface 430 may underline portions of an electronic media item or may display a list of positions or locations of the errors.

In one embodiment, the user interface 430 may accept user input from a user. The user input may indicate how to correct one or more of the errors in the electronic media item. For example, the user input may indicate a change in the size, font, or color of a piece of text. In another example, the user input may indicate a change the background color for a piece of text. In a further example, the user input may indicate a change in the indentation of text or an addition of bullet points in front of text. The content validation module 405 may update the electronic media item based on the user input received from the user interface (e.g., may correct one or more of the errors based on the user input).

In one embodiment, the user interface 430 may provide a user with access to a ticketing or tracking system, which may allow a user (e.g., quality control personnel) to provide information associated with the one or more errors detected by the content validation module 405. For example, the user interface 430 may allow a user to request that an error be fixed by opening a "bug" or "error" ticket. In another example, the user interface 430 may allow a user to input information such as the total number of errors for an electronic media item, the number of each type of error, and other information which may be used to track or monitor the numbers of types of errors in an electronic publication. In another embodiment, the content validation module 405 may automatically provide information associated with the one or more errors (e.g., tracking information such as number of errors or types of errors, information about the location of errors, etc.) to the ticketing or tracking system without requiring user input. For example, the content validation module 405 may automatically open bug or error tickets for the errors detected by the content validation module 405. In one embodiment, the user interface 430 may provide a user with access to an error report which contains information associated with the errors detected in an electronic media item (e.g., total number of errors, number of each type of errors, location of errors, etc.). The user interface 430 may also provide information associated with errors detected in multiple electronic media items. For example, the user interface 430 may provide information about the number of errors detected in electronic media items processed or analyzed in the last 24 hours, or the number of errors detected in electronic media items received from a particular publisher, or the types of errors detected in all electronic media items in a digital content providing system.

Figure 5:
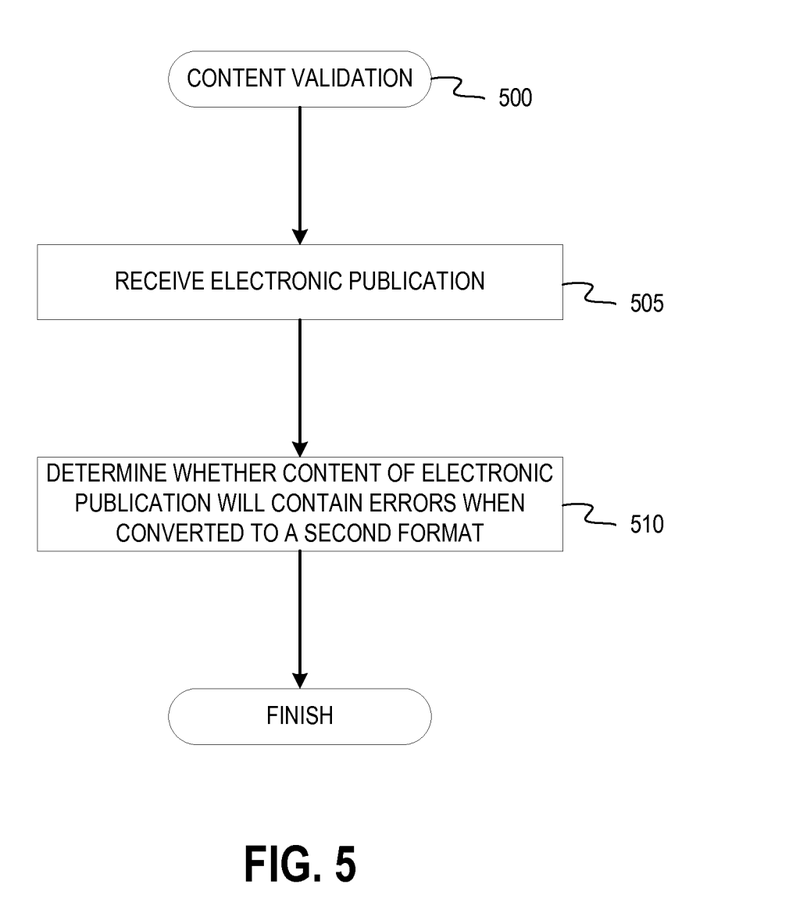
FIG. 5 is a flow diagram illustrating a content validation method, according to an embodiment.
Figure 6:
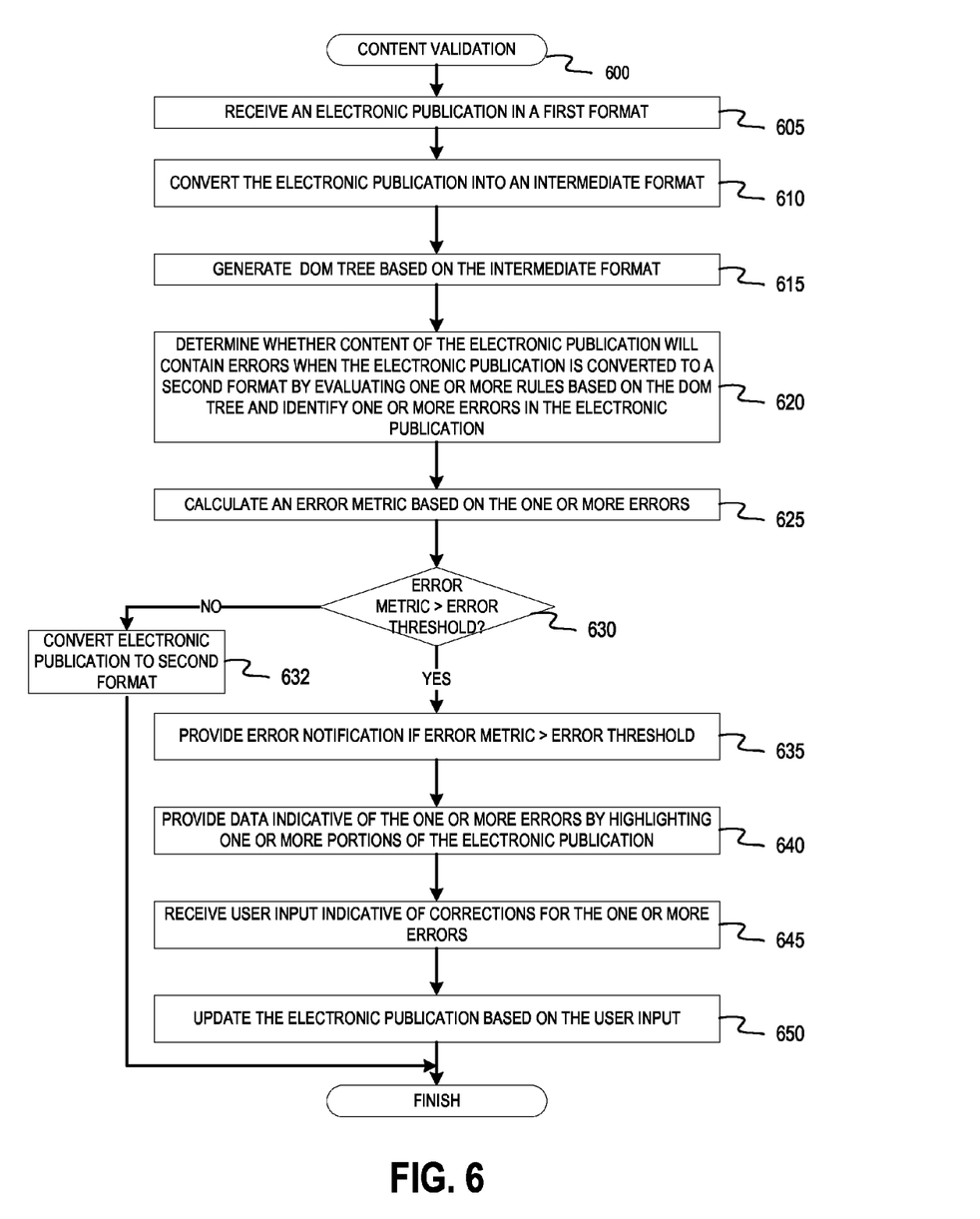
FIG. 6 is a flow diagram illustrating a more detailed content validation method, according to an embodiment.

FIGS. 5 and 6 are flow diagrams illustrating methods for validating content. For simplicity of explanation, the methods are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

FIG. 5 is a flow diagram illustrating a content validation method, according to an embodiment. The method 500 may be performed by processing logic that comprises hardware (e.g., circuitry, dedicated logic, programmable logic, microcode, etc.), software (e.g., instructions run on a processing device to perform hardware simulation), or a combination thereof. The processing logic is configured to analyze an electronic media item in a first format and determine whether the electronic media item (e.g., the content of the electronic media item) will contain errors when the electronic media item is converted to a second format (e.g., to validate the content of the electronic media item). In one embodiment, method 500 may be performed by a content validation module, as shown in FIGS. 1 and 4. In one embodiment, method 500 may be performed immediately as each new electronic media item is received, however in other embodiments, newly received items may be held for a certain period of time (e.g., until the end of the day) and then method 500 is performed for each item received during that time.

Referring to FIG. 5, at block 505, method 500 receives an electronic publication (e.g., an electronic media item) in a first format. The method 500 may obtain the electronic publication from a storage device (e.g., a memory or a hard disk) or may receive the electronic publication from a content provider. At block 510, the method 500 determines whether content of the electronic publication (e.g., the tags, text, characters, sentences, paragraphs, formatting information such as size and color, etc.) will contain errors when the electronic publication is converted to a second format. For example, as discussed above, the method 500 may generate a DOM tree for the electronic publication or may convert the electronic publication to an intermediate format and generate the DOM tree based on the intermediate format. The method 500 may evaluate one or more rules based on or using the DOM tree and may identify or detect one or more errors.

FIG. 6 is a flow diagram illustrating a more detailed content validation method, according to an embodiment. The method 600 may be performed by processing logic that comprises hardware (e.g., circuitry, dedicated logic, programmable logic, microcode, etc.), software (e.g., instructions run on a processing device to perform hardware simulation), or a combination thereof. The processing logic is configured to analyze an electronic media item in a first format and determine whether the electronic media item (e.g., the content of the electronic media item) will contain errors when the electronic media item is converted to a second format (e.g., to validate the content of the electronic media item). In one embodiment, method 600 may be performed by a content validation module, as shown in FIGS. 1 and 4. In one embodiment, method 600 may be performed immediately as each new electronic media item is received, however in other embodiments, newly received items may be held for a certain period of time (e.g., until the end of the day) and then method 600 is performed for each item received during that time.

Referring to FIG. 6, at block 605, method 600 receives an electronic publication (e.g., an electronic media item) in a first format. The method 600 may obtain the electronic publication from a storage device (e.g., a memory or a hard disk) or may receive the electronic publication from a content provider. At block 610, the method 600 converts the electronic publication into an intermediate format (e.g., converts the publication from a PDF format to an HTML format). At block 615, the method 600 generates a DOM tree based on the intermediate format. For example, the method 600 may generate a DOM tree for the electronic publication after it is converted into an intermediate format such as HTML.

At block 620, the method 600 determines whether the electronic publication will contain errors when the electronic publication is converted to a second format. The method 600 evaluates one or more rules based on the DOM tree and identifies one or more errors in the electronic publication using the one or more rules. For example, the method 600 may use the rules to determine whether combinations of one or more of nodes, attributes, and values in the DOM tree are considered error. At block 625, the method 600 calculates an error metric based on the one or more errors and determines whether the error metric exceeds an error threshold at block 630. For example, the method 600 may use the formula discussed above in conjunction with FIGS. 1 and 4. Although the method 600 determines whether the error metric is greater than the error threshold, in other embodiments, the method 600 may determine whether the error metric is greater than or equal to the error threshold. If the error metric does not exceed an error threshold, the proceeds to block 632 where the method converts the electronic publication to the second format. If the error metric does exceed the error threshold, the method 600 provides an error notification (e.g., may send a message to a server or other computer system, may display a message to a user, etc.) indicating that the error metric exceeds the error threshold at block 635. For example, the method 600 may display a message to a user indicating that the error metric exceeds the error threshold. In another example, the method 600 may send a message or other data to a server (or other computing device) indicating that the error metric exceeds the error threshold. The method 600 may also store data indicating that the error metric exceeds the error threshold in a data store (e.g., a database, a memory, a hard disk, etc.).

At block 640, the method 600 may provide data indicative of the one or more errors by highlighting one or more portions of the electronic publication. At block 645, the method 600 may receives user input indicative of corrections for the one or more errors. For example, the method 600 may receive user input correcting one or more of the errors, from a user interface. At block 650, the method 600 may update the electronic publication based on the user input.

In one embodiment, rather than providing data indicative of the one or more errors, receiving user input indicative of corrections and updating the electronic publication based on the user input (as shown in blocks 645, 645, and 650), the method 600 may automatically correct some of the errors. For example, the method 600 may automatically update the formatting attributes or properties of certain HTML tags, when the method 600 detects these tags. In another embodiment, the method 600 may provide data indicative of the one or more errors (e.g., highlight the errors, provide locations of the errors) and may indicate whether an error is fixable. For example, if a particular HTML tag is not supported in MOBI format, this error may not be fixable and the method 600 may provide the location of the error and indicate that the error is not fixable.

In one embodiment, rather than providing data indicative of the one or more errors, receiving user input indicative of corrections and updating the electronic publication based on the user input (as shown in blocks 645, 645, and 650), the method 600 may provide the electronic media item to a queue or other data storage location (e.g., a memory, a hard disk, a database, etc.), where the electronic media item may be manually verified or corrected by a user, or where the electronic media item may be provided to a digital content source (e.g., the publisher of a book) so that the publisher may correct the errors.

Figure 7:
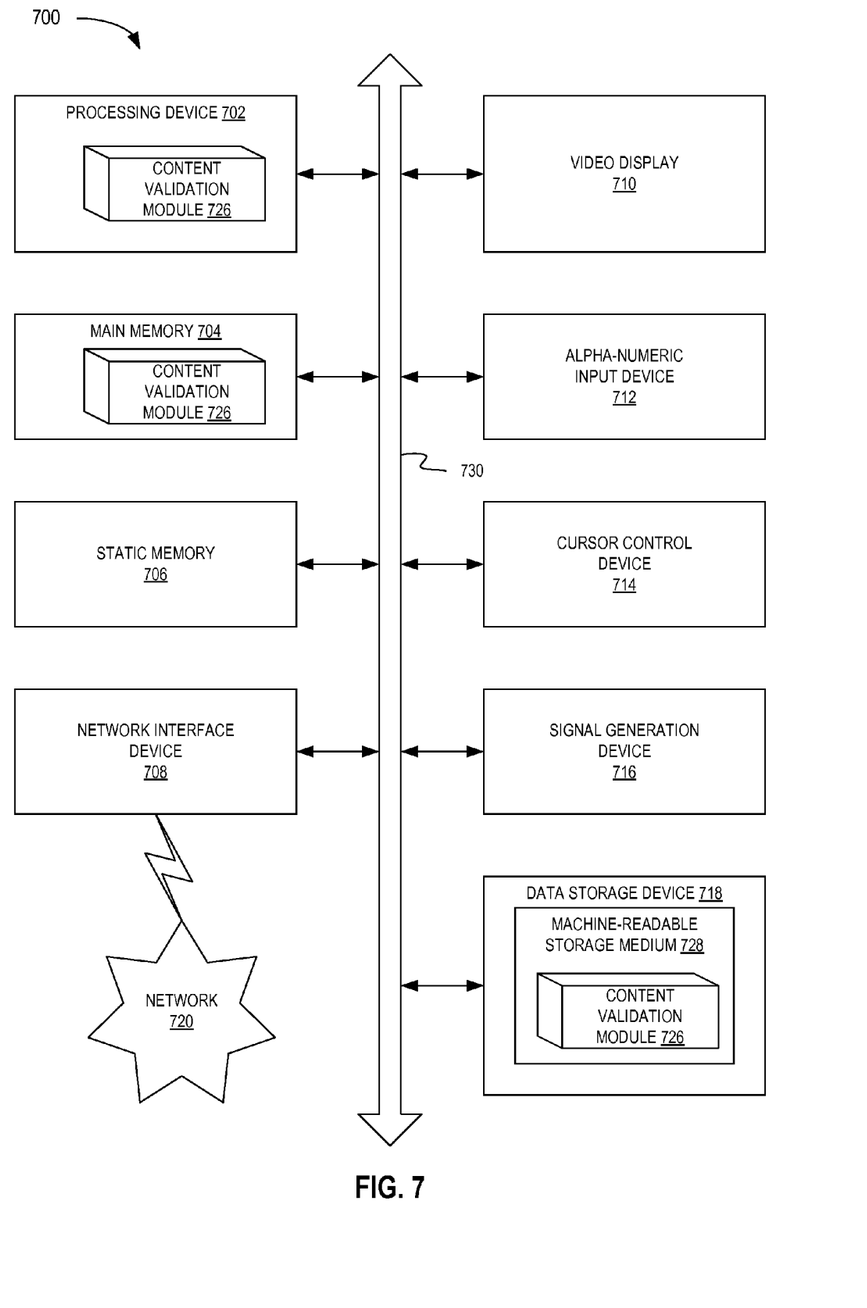
FIG. 7 is a block diagram illustrating one embodiment of a computer system, according to an embodiment.

FIG. 7 illustrates a diagrammatic representation of a machine in the exemplary form of a computer system 700 within which a set of instructions, for causing the machine to perform any one or more of the methodologies discussed herein, may be executed. The system 700 may be in the form of a computer system within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server machine in client-server network environment. The machine may be a personal computer (PC), a set-top box (STB), a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 700 includes a processing device (e.g., a processor) 702, a main memory 704 (e.g., read-only memory (ROM), flash memory, dynamic random access memory (DRAM) such as synchronous DRAM (SDRAM)), a static memory 706 (e.g., flash memory, static random access memory (SRAM)), and a data storage device 718, which communicate with each other via a bus 730.

Processing device 702 represents one or more general-purpose processing devices such as a microprocessor, central processing unit, or the like. More particularly, the processing device 702 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 702 may also be one or more special-purpose processing devices such as an application specific integrated circuit (ASIC), a field programmable gate array (FPGA), a digital signal processor (DSP), network processor, or the like. The processing device 702 is configured to execute the content validation module 726 for performing the operations and steps discussed herein.

The computer system 700 may further include a network interface device 708 which may communicate with a network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The data storage device 718 may include a computer-readable medium 728 on which is stored one or more sets of instructions (e.g., instructions of content validation module 127) embodying any one or more of the methodologies or functions described herein. The content validation module 726 may also reside, completely or at least partially, within the main memory 704 and/or within the processing device 702 during execution thereof by the computer system 700, the main memory 704 and the processing device 702 also constituting computer-readable media. The instructions may further be transmitted or received over a network 720 via the network interface device 708.

While the computer-readable storage medium 728 is shown in an exemplary embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present invention. The term "computer-readable storage medium" shall accordingly be taken to include, but not be limited to, solid-state memories, optical media, and magnetic media.

In the above description, numerous details are set forth. It will be apparent, however, to one of ordinary skill in the art having the benefit of this disclosure, that embodiments of the invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "generating," "determining," "calculating," "refraining," "providing," "highlighting," "updating," "converting," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments of the invention also relate to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   receiving, by a processing device, an electronic publication in a first format;
   generating, by the processing device, a document object model (DOM) tree for the electronic publication;
   prior to conversion of the electronic publication to a second format, determining, by the processing device, the electronic publication will contain errors after conversion of the electronic publication to the second format by applying one or more rules associated with the second format to the DOM tree and identifying a plurality of errors in the electronic publication;
   determining, by the processing device, a first error type associated with a first error of the plurality of errors;
   determining, by the processing device, a second error type associated with a second error of the plurality of errors;
   assigning a first weight to the first error type and a second weight to the second error type, wherein the first weight represents a severity associated with the first error type, and wherein the second weight represents a severity associated with the second error type;
   calculating, by the processing device, an error metric based on the first weight assigned to the first error type and the second weight assigned to the second error type;
   determining, by the processing device, a size of the electronic publication;
   calculating, by the processing device, an error threshold as a function of the size of the electronic publication, wherein the error threshold is directly proportional to the size of the electronic publication;
   determining, by the processing device, the error metric does not exceed the error threshold; and
   converting the electronic publication from the first format to the second format in response to determining the error metric does not exceed the error threshold.

2. The method of claim 1, further comprising:
   highlighting one or more portions in the content of the electronic publication, wherein each of the one or more portions corresponds to a source of one of the one or more errors;
   receiving user input indicative of one or more corrections for the one or more errors;
   updating the electronic publication based on the user input.

3. The method of claim 1, wherein generating a document object model (DOM) tree for the electronic publication comprises:
   converting the electronic publication to an intermediate format; and
   generating the DOM tree based on the intermediate format.

4. The method of claim 3, wherein the intermediate format comprises at least one of a hypertext markup language format and an extensible markup language format.

5. The method of claim 1, wherein the one or more rules indicate a combination of a first node of the DOM tree and a second node of the DOM tree constitutes an error.

6. An apparatus comprising:
   a processing device to:
   receive an electronic publication in a first format;
   prior to conversion of the electronic publication to a second format, determine the electronic publication will contain one or more errors upon conversion of the electronic publication to the second format by applying one or more rules associated with the second format to a document object model (DOM) tree for the electronic publication and identify a plurality of errors in the electronic publication;

determine a first error type associated with a first error of the plurality of errors;

determine a second error type associated with a second error of the plurality of errors;

assign a first weight to the first error type and a second weight to the second error type, wherein the first weight represents a severity associated with the first error type, and wherein the second weight represents a severity associated with the second error type;

calculate an error metric based on the first weight assigned to the first error type and the second weight assigned to the second error type;

determine, by the processing device, a size of the electronic publication;

calculate an error threshold as a function of the size of the electronic publication, wherein the error threshold is directly proportional to the size of the electronic publication;

determine the error metric does not exceed the error threshold; and convert the electronic publication from the first format to the second format in response to a determination that the error metric does not exceed the error threshold.

7. The apparatus of claim 6, the processing device to:
convert the electronic publication to an intermediate format; and
generate the DOM tree based on the intermediate format.

8. The apparatus of claim 7, wherein the intermediate format comprises at least one of a hypertext markup language format and an extensible markup language format.

9. The apparatus of claim 6, wherein the one or more rules indicate a combination of a first node of the DOM tree and a second node of the DOM tree constitutes an error.

10. The apparatus of claim 6, wherein the processing device to:
highlight one or more portions in the content of the electronic publication, wherein each of the one or more portions corresponds to a source of one of the one or more errors;
receive user input indicative of one or more corrections for the one or more errors; and
update the electronic publication based on the user input.

11. The apparatus of claim 6, wherein the second format supports one or more of security features or digital rights management features.

12. The apparatus of claim 6, wherein the one or more errors comprise one or more of informational errors, content errors, formatting errors or display errors.

13. The apparatus of claim 12, wherein the processing device to:
determine a number of informational errors in the electronic publication.

14. A non-transitory computer-readable storage medium storing instructions which, when executed, cause a processing device to perform a method comprising:
receiving, by the processing device, an electronic publication in a first format;
prior to conversion of the electronic publication to a second format, determining, by the processing device, the electronic publication will contain one or more errors upon conversion of the electronic publication to the second format by applying one or more rules associated with the second format to a document object model (DOM) tree for the electronic publication and identifying a plurality of errors in the electronic publication;
determining, by the processing device, a first error type associated with a first error of the plurality of errors;
determining, by the processing device, a second error type associated with a second error of the plurality of errors;
assigning a first weight to the first error type and a second weight to the second error type, wherein the first weight represents a severity associated with the first error type, and wherein the second weight represents a severity associated with the second error type;
calculating, by the processing device, an error metric based on the first weight assigned to the first error type and the second weight assigned to the second error type;
determining, by the processing device, a size of the electronic publication;
calculating, by the processing device, an error threshold as a function of the size of the electronic publication, wherein the error threshold is directly proportional to the size of the electronic publication;
determining, by the processing device, the error metric does not exceed the error threshold; and
converting the electronic publication from the first format to the second format in response to determining the error metric does not exceed the error threshold.

15. The non-transitory computer-readable storage medium of claim 14, wherein the DOM tree for the electronic publication is generated by:
converting the electronic publication to an intermediate format; and
generating the DOM tree based on the intermediate format.

16. The non-transitory computer-readable storage medium of claim 15, wherein the intermediate format comprises at least one of a hypertext markup language format and an extensible markup language format.

17. The non-transitory computer-readable storage medium of claim 14, wherein the one or more rules indicate a combination of a first node of the DOM tree and a second node of the DOM tree constitutes an error.

18. The non-transitory computer-readable storage medium of claim 14, wherein the method further comprises:
highlighting one or more portions in the content of the electronic publication, wherein each of the one or more portions corresponds to a source of one of the one or more errors;
receiving user input indicative of one or more corrections for the one or more errors; and
updating the electronic publication based on the user input.

19. The non-transitory computer-readable storage medium of claim 14, wherein the second format supports one or more of security features or digital rights management features.

20. The non-transitory computer-readable storage medium of claim 14, wherein the one or more errors comprise one or more of informational errors, content errors, formatting errors or display errors.

21. The non-transitory computer-readable storage medium of claim 20, wherein the method further comprises:
determining a number of informational errors in the electronic publication.

* * * * *